United States Patent
Saitoh et al.

(10) Patent No.: US 8,981,428 B2
(45) Date of Patent: Mar. 17, 2015

(54) SEMICONDUCTOR DEVICE INCLUDING GAN-BASED COMPOUND SEMICONDUCTOR STACKED LAYER AND METHOD FOR PRODUCING THE SAME

(75) Inventors: Yu Saitoh, Itami (JP); Masaya Okada, Osaka (JP); Masaki Ueno, Itami (JP); Makoto Kiyama, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/822,591

(22) PCT Filed: Jul. 6, 2011

(86) PCT No.: PCT/JP2011/065469
§ 371 (c)(1),
(2), (4) Date: Mar. 12, 2013

(87) PCT Pub. No.: WO2012/056770
PCT Pub. Date: May 3, 2012

(65) Prior Publication Data
US 2013/0181226 A1    Jul. 18, 2013

(30) Foreign Application Priority Data

Oct. 27, 2010    (JP) .................................. 2010-240831

(51) Int. Cl.
*H01L 29/66* (2006.01)
*H01L 29/778* (2006.01)
(Continued)

(52) U.S. Cl.
CPC ........ *H01L 29/7788* (2013.01); *H01L 21/3006* (2013.01); *H01L 29/66462* (2013.01);
(Continued)

(58) Field of Classification Search
CPC ..................... H01L 21/3006; H01L 29/66431; H01L 29/66462; H01L 29/7788; H01L 29/7789; H01L 31/0304; H01L 33/025; H01L 33/32
USPC ........... 257/76, 103, 184, E33.023, E33.025, 257/183, 194; 438/29, 46, 172, 189
See application file for complete search history.

(56) References Cited

U.S. PATENT DOCUMENTS

2002/0182791 A1* 12/2002 Yoshida ......................... 438/194
2006/0220044 A1* 10/2006 Sugawara et al. ............... 257/96
(Continued)

FOREIGN PATENT DOCUMENTS

JP    2003-068745 A    3/2003
JP    2005-286318 A    10/2005
(Continued)

OTHER PUBLICATIONS

International Search Report in International Patent Application No. PCT/JP2011/065469, dated Sep. 13, 2011.

*Primary Examiner* — Benjamin Sandvik
*Assistant Examiner* — Farid Khan
(74) *Attorney, Agent, or Firm* — Venable LLP; Michael A. Sartori; Tamatane J. Aga (57) ABSTRACT

There are provided a semiconductor device in which a drain leak current can be reduced in the transistor operation while high vertical breakdown voltage is achieved and a method for producing the semiconductor device. In the semiconductor device, an opening 28 that extends from an n⁺-type contact layer 8 and reaches an n-type drift layer 4 through a p-type barrier layer 6 is formed. The semiconductor device includes a regrown layer 27 located so as to cover portions of the p-type barrier layer 6 and the like that are exposed to the opening, the regrown layer 27 including an undoped GaN channel layer 22 and a carrier supply layer 26; an insulating layer 9 located so as to cover the regrown layer 27; and a gate electrode G located on the insulating layer 9. In the p-type barrier layer, the Mg concentration A ($cm^{-3}$) and the hydrogen concentration B ($cm^{-3}$) satisfy $0.1 < B/A < 0.9$ ... (1).

14 Claims, 6 Drawing Sheets

(51) Int. Cl.
*H01L 21/30* (2006.01)
*H01L 21/02* (2006.01)
*H01L 29/20* (2006.01)
*H01L 29/423* (2006.01)

(52) U.S. Cl.
CPC ...... *H01L29/7789* (2013.01); *H01L 29/66431* (2013.01); *H01L 21/0254* (2013.01); *H01L 21/02573* (2013.01); *H01L 21/0262* (2013.01); *H01L 29/2003* (2013.01); *H01L 29/4238* (2013.01)
USPC .............. 257/194; 257/76; 257/183; 438/172

(56) References Cited

U.S. PATENT DOCUMENTS

| | | | |
|---|---|---|---|
| 2006/0220060 A1* | 10/2006 | Nakata et al. | 257/189 |
| 2007/0187693 A1* | 8/2007 | Kobayakawa et al. | 257/76 |
| 2009/0045434 A1* | 2/2009 | Muraki et al. | 257/103 |
| 2010/0248455 A1* | 9/2010 | Okuno | 438/478 |
| 2012/0058577 A1* | 3/2012 | Yoshida et al. | 438/14 |

FOREIGN PATENT DOCUMENTS

| | | |
|---|---|---|
| JP | 2006-286942 A | 10/2006 |
| JP | 2007-258304 A | 10/2007 |
| JP | 2008-177514 A | 7/2008 |

* cited by examiner

SEMICONDUCTOR DEVICE INCLUDING GAN-BASED COMPOUND SEMICONDUCTOR STACKED LAYER AND METHOD FOR PRODUCING THE SAME

TECHNICAL FIELD

The present invention relates to a vertical semiconductor device that is used for high power switching and has low on-resistance and whose drain leak current is reduced and a method for producing the vertical semiconductor device.

BACKGROUND ART

Low on-resistance, reduction in drain leak current, and high reverse breakdown voltage are required for high-current switching devices. Field effect transistors (FETs) that use a group III nitride-based semiconductor are excellent in terms of, for example, high breakdown voltage and high-temperature operation because of their wide band gap. Therefore, vertical transistors that use a GaN-based semiconductor have been particularly receiving attention as transistors for controlling high power. For example, PTL 1 proposes a vertical GaN-based FET whose mobility is increased and whose on-resistance is decreased by forming an opening in a GaN-based semiconductor and forming a regrown layer including a channel of two-dimensional electron gas (2DEG) on the side surface of the opening.

CITATION LIST

Patent Literature

PTL 1: Japanese Unexamined Patent Application Publication No. 2006-286942

SUMMARY OF INVENTION

Technical Problem

In the vertical FET, a p-type GaN layer that produces an effect of a guard ring is disposed in a portion, around an opening, on which a regrown layer is to be formed. Consequently, an npn structure is formed and therefore vertical breakdown voltage characteristics can be ensured while high mobility is achieved due to the two-dimensional electron gas that forms the channel. However, such a semiconductor device is not always satisfactory in terms of reduction in drain leak current in the transistor operation because of its unique structure having an opening.

It is an object of the present invention to provide a semiconductor device in which a drain leak current can be stably reduced in the transistor operation while high vertical breakdown voltage is achieved and a method for producing the semiconductor device.

Solution to Problem

A semiconductor device of the present invention includes a GaN-based compound semiconductor stacked layer (GaN-based stacked layer) including a first conductivity-type drift layer, a second conductivity-type barrier layer located on the first conductivity-type drift layer, and a first conductivity-type contact layer located on the second conductivity-type barrier layer. In the semiconductor device, the GaN-based stacked layer has an opening that extends from the first conductivity-type contact layer and reaches the first conductivity-type drift layer through the second conductivity-type barrier layer. The semiconductor device includes a regrown layer located so as to cover an end face of the GaN-based stacked layer that is exposed to the opening, the regrown layer including a channel layer composed of a GaN-based semiconductor and a carrier supply layer that supplies carriers to the channel layer; an insulating layer located so as to cover the regrown layer; a source electrode located on the GaN-based stacked layer; a gate electrode located on the insulating layer; and a drain electrode located on any one of first conductivity-type regions that are present opposite the first conductivity-type contact layer with a bottom of the opening located therebetween. In the second conductivity-type barrier layer, a second conductivity-type impurity concentration A ($cm^{-3}$) and a hydrogen concentration B ($cm^{-3}$) satisfy $0.1 < B/A < 0.9$ . . . (1).

According to the above structure, the drain leak current in the transistor operation can be reduced while good vertical breakdown voltage characteristics are achieved by the second conductivity-type barrier layer. When an opening is formed by RIE or the like, for example, the end portion of the GaN-based stacked layer that constitutes the inclined surface of the opening is damaged due to ion irradiation and dangling bonds and the like are formed. In this damaged portion, conductive impurities derived from an RIE device or other unspecified sources are enriched. If there is no impurity that passivates a second conductivity-type impurity, a drain leak current is generated through the damaged portion or the enriched region of the conductive impurities.

In the present invention, hydrogen is distributed in a high concentration so that the above range is satisfied. Therefore, the dangling bonds and the like are terminated and the enriched region of conductive impurities is passivated. As a result, the drain leak current can be reduced.

If the value of B/A is more than 0.9, an effect of improving breakdown voltage characteristics, the effect being originally produced by the second conductivity-type barrier layer, disappears because hydrogen passivates a second conductivity-type impurity and thus the amount of impurity atom that functions as the second conductivity-type impurity is excessively decreased. If the value of B/A is less than 0.1, highly dense dangling bonds and the like cannot be terminated and enriched conductive impurities cannot be passivated, whereby a drain leak current cannot be reduced.

The opening is formed in order to allow high electric current to flow in a vertical direction with low on-resistance by generating two-dimensional electron gas (2DEG), for example, in a channel layer that covers the wall surface (inclined surface) of the opening. According to the present invention, by terminating the dangling bonds generated when the opening is formed and passivating conductive impurities enriched in the damaged portion, the leak path can be removed or the effect of drain leak current can be reduced.

The GaN-based stacked layer is obtained by performing epitaxial growth on a predetermined crystal face of GaN. The GaN base may be a GaN substrate or a GaN film on a support substrate. Alternatively, by forming a GaN layer on a GaN substrate or the like during the growth of a GaN-based stacked layer and then removing a portion having a certain thickness corresponding to the thickness of the GaN substrate or the like, only a thin GaN layer may be left as a base in the form of products. The thin GaN layer left as a base may be a conductive or nonconductive layer. A drain electrode can be disposed on the top or bottom surface of the thin GaN layer depending on the production process and the structure of products.

In the case where the GaN substrate, the support substrate, or the like is left in a product, the support substrate or the substrate may be a conductive or nonconductive substrate. When the support substrate or the substrate is a conductive substrate, the drain electrode can be disposed directly on the bottom (lower) surface or top (upper) surface of the support substrate or the substrate. When the support substrate or the substrate is a nonconductive substrate, the drain electrode can be disposed above the nonconductive substrate and on a conductive layer located on the lower layer side in the semiconductor layers.

In the second conductivity-type barrier layer, the second conductivity-type impurity concentration A ($cm^{-3}$) and the hydrogen concentration B ($cm^{-3}$) can satisfy $0.5<B/A<0.9$ ... (2).

When hydrogen is distributed in a high concentration to an extent that the value of B/A exceeds 0.5, the dangling bonds and the like can be further terminated and the enriched region of conductive impurities can be passivated. Thus, a drain leak current can be reduced with more certainty.

In the second conductivity-type barrier layer, the second conductivity-type impurity concentration A ($cm^{-3}$) and the hydrogen concentration B ($cm^{-3}$) can satisfy $0.7<B/A<0.9$ ... (3).

When hydrogen is distributed in a high concentration to an extent that the value of B/A exceeds 0.7, the dangling bonds and the like can be terminated to a higher degree. As a result, the enriched region of conductive impurities can be passivated to a high degree. Thus, a drain leak current can be reduced to a higher degree.

The first conductivity-type can be an n-type, the second conductivity-type can be a p-type, and a p-type impurity contained in the p-type barrier layer can be magnesium (Mg).

According to this, good breakdown voltage characteristics, reduced drain leak current, and flow of high current with low on-resistance can be realized in a vertical GaN-based semiconductor device using existing apparatuses, techniques that have been accumulated in GaN-based semiconductors, and the like.

The magnesium concentration in the p-type barrier layer can be $5 \times 10^{17} cm^{-3}$ or more and $5 \times 10^{18} cm^{-3}$ or less, and the hydrogen concentration in the p-type barrier layer can be $4 \times 10^{17} cm^{-3}$ or more and $4 \times 10^{18} cm^{-3}$ or less.

According to this, good breakdown voltage characteristics can be achieved using the p-type barrier layer having good crystallinity, and furthermore the drain leak current can be reduced while an opening that allows high-current operation with low on-resistance is formed.

The concentration of silicon (Si) serving as an n-type impurity in the n-type contact layer can be $1 \times 10^{17} cm^{-3}$ or more, and the silicon concentration in the n-type drift layer can be $1 \times 10^{15} cm^{-3}$ or more and $5 \times 10^{16} cm^{-3}$ or less.

According to this structure, the n-type contact layer is in ohmic contact with the source electrode. The n-type drift layer maintains the controllability during the transistor operation and achieves low on-resistance while at the same time an effect of improving the breakdown voltage characteristics using the p-type barrier layer can be maintained.

The n-type contact layer can have a thickness of 0.1 μm or more and 1.0 μm or less, the p-type barrier layer can have a thickness of 0.1 μm or more and 2.0 μm or less, and the n-type drift layer can have a thickness of 1 μm or more and 10 μm or less.

According to the above structure, a vertical GaN-based semiconductor device that stably allows high-current switching can be provided.

A combination of the channel layer and carrier supply layer can be one of combinations selected from an InGaN layer and an AlGaN layer, a GaN layer and an AlGaN layer, and an AlGaN layer and AN.

According to the above combination, at least the channel layer (electron drift layer) is epitaxially grown on the GaN-based stacked layer, and 2DEG is generated at the interface between the channel layer and carrier supply layer due to piezoelectric polarization caused by lattice distortion. As a result, a high current can be caused to flow in a vertical direction with low on-resistance.

The channel layer can be an undoped GaN layer having a thickness of 20 nm or more and 400 nm or less, and the carrier supply layer can be an $Al_xGa_{1-x}N$ ($0<x<1$) layer having a thickness of 5 nm or more and 40 nm or less.

According to this, a regrown layer (channel layer and carrier supply layer) having good crystallinity can be provided. As a result, low on-resistance, good breakdown voltage characteristics, and reduced drain leak current can be achieved.

In a method for producing a semiconductor device of the present invention, a semiconductor device including a GaN-based compound semiconductor stacked layer (GaN-based stacked layer) including a first conductivity-type drift layer, a second conductivity-type barrier layer located on the first conductivity-type drift layer, and a first conductivity-type contact layer located on the second conductivity-type barrier layer is produced. The production method includes a step of forming an opening in the GaN-based stacked layer by reactive ion etching (RIE) so that the opening extends from the first conductivity-type contact layer and reaches the first conductivity-type drift layer through the second conductivity-type barrier layer; a step of forming a regrown layer so as to cover a portion of the GaN-based stacked layer that is exposed to the opening, the regrown layer including a channel layer composed of a GaN-based semiconductor and a carrier supply layer that supplies carriers to the channel layer; a step of forming an insulating layer so as to cover the regrown layer; and a step of forming a source electrode on the GaN-based stacked layer, forming a gate electrode on the insulating layer, and forming a drain electrode on any one of first conductivity-type regions that are present opposite the first conductivity-type contact layer with a bottom of the opening located therebetween. In the formation of the second conductivity-type barrier layer, a second conductivity-type impurity concentration A ($cm^{-3}$) and a hydrogen concentration B ($cm^{-3}$) satisfy $0.1<B/A<0.9$ ... (1).

According to the above method, a vertical GaN-based semiconductor device used for high-current switching can be produced in a simple manner. In the semiconductor device, good breakdown voltage characteristics, reduced drain leak current, and low on-resistance can be realized.

In the formation of the second conductivity-type barrier layer, the second conductivity-type impurity concentration A ($cm^{-3}$) and the hydrogen concentration B ($cm^{-3}$) can satisfy $0.5<B/A<0.9$ ... (2).

When hydrogen is distributed in a high concentration to an extent that the value of B/A exceeds 0.5, the dangling bonds and the like can be further terminated and the enriched region of conductive impurities can be passivated. Thus, a drain leak current can be reduced with more certainty.

In the formation of the second conductivity-type barrier layer, the second conductivity-type impurity concentration A ($cm^{-3}$) and the hydrogen concentration B ($cm^{-3}$) can satisfy $0.7<B/A<0.9$ ... (3).

When hydrogen is distributed in a high concentration to an extent that the value of B/A exceeds 0.7, the dangling bonds and the like can be terminated to a higher degree and the enriched region of conductive impurities can be passivated to a high degree. Thus, a drain leak current can be reduced to a higher degree.

The first conductivity-type can be an n-type; the second conductivity-type can be a p-type; and the p-type barrier layer can be grown by MOCVD using high-purity ammonia as a nitrogen raw material, purified hydrogen as a carrier gas, and bis(cyclopentadienyl) magnesium as a raw material for a p-type impurity.

According to this, a GaN-based semiconductor device in which breakdown voltage characteristics are improved and a drain leak current is reduced can be easily produced using an existing apparatus.

In the step of forming the regrown layer after the opening is formed by RIE, thermal cleaning may be performed in an (ammonia +hydrogen) atmosphere, and then an undoped GaN channel layer and an undoped AlGaN carrier supply layer may be grown by MOCVD using high-purity ammonia as a nitrogen raw material and purified hydrogen as a carrier gas.

According to this method, hydrogen contained in the p-type GaN barrier layer is prevented from escaping from the end face before or during the growth of the regrown layer, whereby the hydrogen can contribute to the restoration regarding the damage and the passivation of impurities.

Advantageous Effects of Invention

According to the semiconductor device or the like of the present invention, a drain leak current can be stably reduced while good vertical breakdown voltage characteristics are achieved.

DESCRIPTION OF EMBODIMENTS

Figure 1:
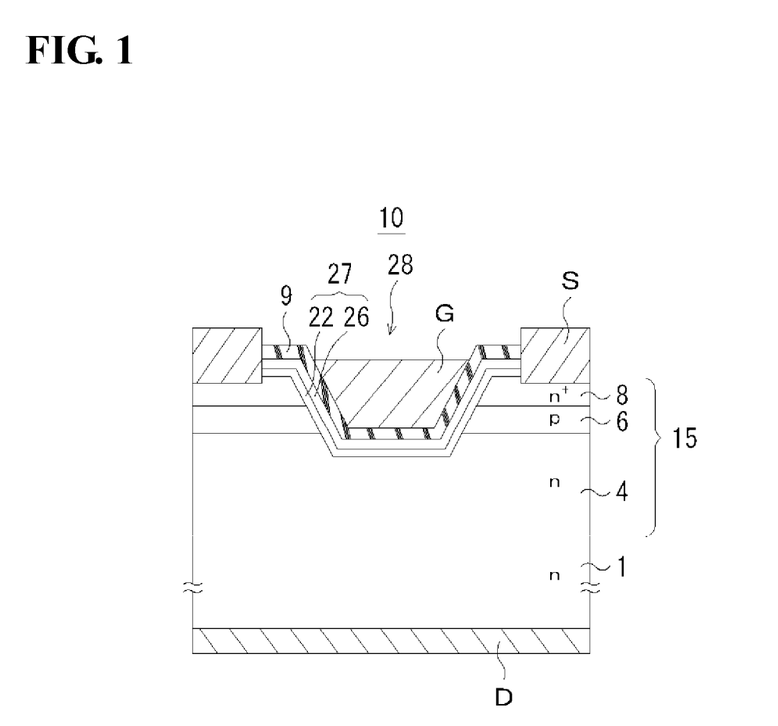
FIG. 1 shows a vertical GaN-based FET according to an embodiment of the present invention and is a sectional view taken along line I-I of FIG. 2.

FIG. 1 is a sectional view showing a semiconductor device 10 according to an embodiment of the present invention. The semiconductor device 10 has a layered structure of (GaN-based substrate 1). An opening 28 that extends from the surface of an n$^+$-type GaN contact layer 8 and reaches an n-type drift layer 4 is formed. The name "contact layer 8" is an alternative name given to a top layer 8 and is used when the arrangement of an electrode is emphasized. When a top layer of a stacked layer is emphasized, the contact layer 8 is also referred to as a cap layer. A p-type barrier layer 6 is an alternative name given to a p-type layer 6 and is used to emphasize a barrier layer against electrons. The (n$^+$-type GaN cap layer 8/p-type GaN barrier layer 6/n-type GaN drift layer 4) on the top layer side may be referred to as a GaN-based stacked layer 15.

A regrown layer 27 including an electron drift layer (channel layer) 22 and an electron source layer (carrier supply layer) 26 is formed so as to cover a portion of the GaN-based semiconductor layer 15, the portion being exposed to the opening 28. A gate electrode G is disposed above the regrown layer 27 with an insulating layer 9 disposed therebetween. A source electrode S is formed on the GaN-based stacked layer 15. A drain electrode D is disposed so as to face the source electrode S, with the n-type GaN drift layer 4 and the like sandwiched therebetween. The electron drift layer (channel layer) 22 is formed of an undoped GaN layer and the electron source layer (carrier supply layer) 26 is formed of an AlGaN layer. Two-dimensional electron gas (2DEG) is formed at an interface between the electron drift layer 22 and the electron source layer 26. The 2DEG constitutes a channel of a vertical electric current flowing between the source electrode S and the drain electrode D.

In the GaN-based stacked layer 15, the p-type GaN barrier layer 6 is inserted between the n-type GaN drift layer 4 and the n$^+$-type GaN contact layer 8, whereby an npn structure is formed. As a result, vertical breakdown voltage characteristics, which are important characteristics in switching devices that allow high electric current to flow in a vertical direction, can be improved. However, as described above, such a semiconductor device is not always satisfactory in terms of reducing a drain leak current with certainty in the transistor operation because of its unique structure having an opening.

The feature of the semiconductor device 10 according to this embodiment is to satisfy the following formula (1). Herein, the concentration of Mg, which is a p-type impurity, in the p-type barrier layer 6 is defined as "A" and the concentration of hydrogen in the p-type barrier layer 6 is defined as "B".

$$0.1 < B/A < 0.9 \qquad (1)$$

To reduce the drain leak current with more certainty, the following formula (2) can be satisfied.

$$0.5 < B/A < 0.9 \qquad (2)$$

To further reduce the drain leak current, the following formula (3) may be satisfied.

$$0.7 < B/A < 0.9 \qquad (3)$$

The semiconductor device 10 shown in FIG. 1 is a device which satisfies the formula (3) above and in which a high level of restoration regarding the above-described damage has been performed.

The GaN-based stacked layer 15 has the opening 28 that penetrates the n$^+$-type GaN contact layer 8 and the p-type GaN barrier layer 6 and reaches the n-type GaN drift layer 4. As described in the production method below, the opening 28 is normally formed by RIE or the like, and the GaN-based stacked layer 15 is etched by being irradiated with ions so as to have an inclined surface. The end face of the p-type barrier layer 6 exposed to the opening 28 and a portion near the end face are damaged due to the ion irradiation of the RIE or the like. Consequently, dangling bonds, lattice defects, and the like are formed at a high density. Furthermore, conductive impurities reach the damaged portion from an RIE device, jigs of the RIE device, and other unspecified portions, and enrichment occurs. Therefore, before the formation of the regrown layer 27 including the electron drift layer 22 and the carrier supply layer 26, such a damaged portion in which conductive impurities are enriched is formed on and around the end face of the p-type GaN barrier layer 6 exposed to the opening 28. When a product is finished by forming the regrown layer 27 and each electrode and then the transistor is operated, a non-negligible drain leak current flows through the damaged portion.

By satisfying any one of the formulae (1) to (3) above, in particular, at least the formula (1), the following effects can be produced.

(E1) By incorporating hydrogen in the p-type GaN barrier layer in a certain concentration, hydrogen is enriched in the damaged portion formed on and around the end face of the p-type GaN barrier layer during the growth of the regrown layer 27. The enriched hydrogen terminates the dangling bonds and the like in the damaged portion and passivates the enriched conductive impurities. As a result, a drain leak current generated during the transistor operation can be reduced.

(E2) If the value of B/A is less than 0.1, the amount of hydrogen is excessively small and thus the above effect of hydrogen cannot be produced. That is, the restoration regarding damage such as dangling bonds and the passivation of conductive impurities cannot be performed. On the other hand, if the value of B/A is more than 0.9, an effect of improving breakdown voltage characteristics, the effect being originally produced by the p-type GaN barrier layer 6, disappears because hydrogen inactivates a function of Mg as a p-type impurity.

By satisfying at least the formula (1) among the formulae (1) to (3), the drain leak current can be reduced while the breakdown voltage characteristics are ensured. By relatively increasing the hydrogen concentration as in the formula (2) or (3) above, a higher level of restoration (e.g., termination of dangling bonds) regarding the damaged portion can be performed.

Figure 2:
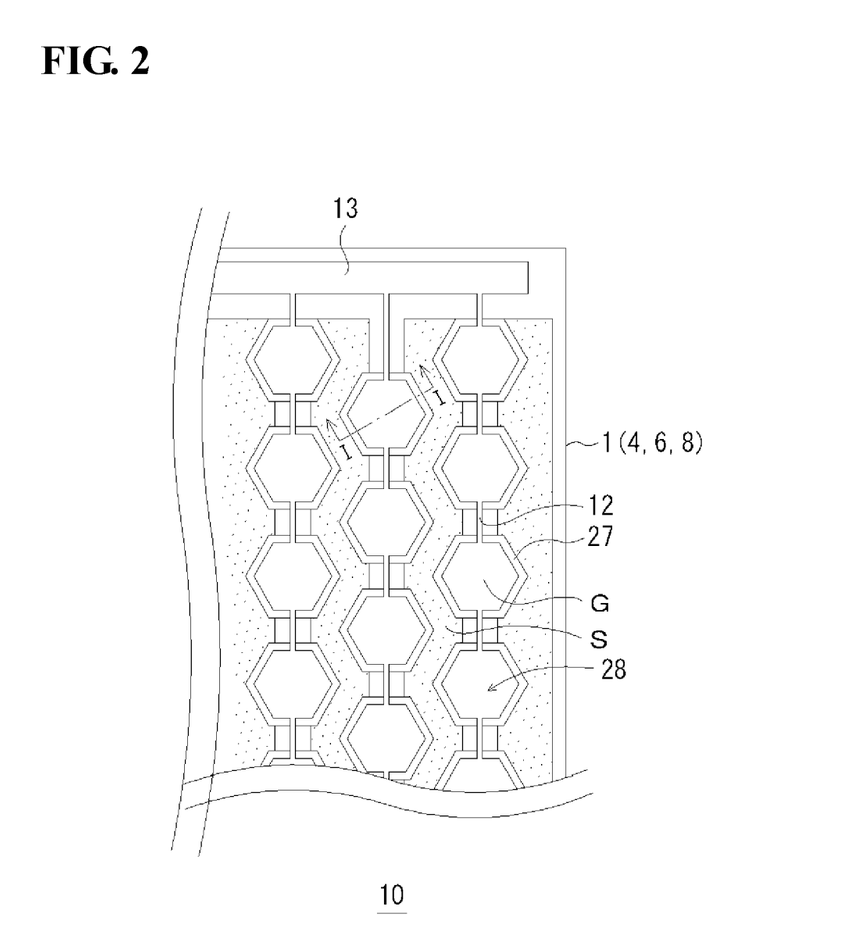
FIG. 2 is a plan view of a chip in which the semiconductor device in FIG. 1 is formed.

FIG. 2 is a plan view of a chip in which the semiconductor device is formed and shows which part of the chip the sectional view of FIG. 1 corresponds to. As shown in FIG. 2, the opening 28 and the gate electrode G have a hexagonal shape and a region around the gate electrode G is substantially covered with the source electrode S while the source electrode S does not overlap a gate wiring line 12. Consequently, a closest-packed structure (honey-comb structure) is formed and thus the gate electrode G has a long perimeter per unit area, that is, the on-resistance can be decreased. An electric current flows through a path of source electrode S→channel in the regrown layer 27→n-type GaN drift layer 4→drain electrode D. In order to prevent the source electrode S and the wiring line thereof from interfering with a gate structure including the gate electrode G, the gate wiring line 12, and a gate pad 13, the source wiring line is disposed on an interlayer-insulating layer (not shown). A via hole is formed in the interlayer-insulating layer, and the source electrode S including a conductive plug is conductively connected to a source conductive layer (not shown) on the interlayer-insulating layer. As a result, a source structure including the source electrode S can have low electrical resistance and high mobility, which are suitable for high-power devices.

The perimeter of the opening per unit area can also be increased by densely arranging elongated openings instead of employing the hexagonal honey-comb structure. Consequently, the current density can be improved.

Figure 3:
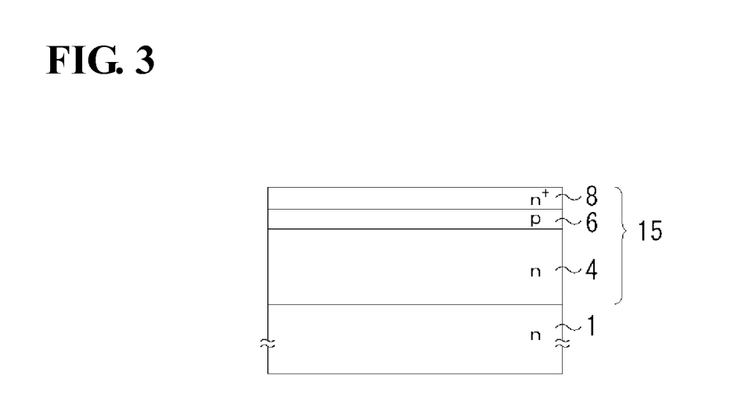
FIG. 3 is a diagram showing the state in which a GaN-based stacked layer has been formed on a GaN substrate.

A method for producing the semiconductor device 10 according to this embodiment will be described. As shown in FIG. 3, a GaN-based stacked layer 15 including n-type GaN drift layer 4/p-type GaN barrier layer 6/$n^+$-type GaN contact layer 8 is epitaxially grown on a GaN substrate 1 corresponding to the above-described GaN substrate.

A GaN-based buffer layer (not shown) may be inserted between the GaN substrate 1 and the n-type GaN drift layer 4.

The formation of the above layers is performed by, for example, metal-organic chemical vapor deposition (MOCVD). By performing growth using MOCVD, a GaN-based stacked layer 15 having good crystallinity can be formed while the formula (1) above is satisfied. In the case where the GaN substrate 1 is formed by growing a gallium nitride film on a conductive substrate using MOCVD, trimethylgallium is used as a gallium raw material. High-purity ammonia is used as a nitrogen raw material. Purified hydrogen is used as a carrier gas.

The purity of the high-purity ammonia is 99.999% or more and the purity of the purified hydrogen is 99.999995% or more. A hydrogen-based silane is used as a Si raw material for an n-type dopant and bis(cyclopentadienyl) magnesium is used as a Mg raw material for a p-type dopant.

A conductive gallium nitride substrate having a diameter of two inches is used as the conductive substrate. The substrate is cleaned at 1030° C. at 100 Torr in an atmosphere of ammonia and hydrogen.

Subsequently, the temperature is increased to 1050° C. and a gallium nitride layer is grown at 200 Torr at a V/III ratio of 1500. The formation method of the GaN layer on the conductive substrate is employed for not only the formation of the GaN substrate 1 but also the growth of the GaN-based stacked layer 15 on the GaN substrate 1.

By employing the above-described method, the n-type GaN drift layer 4/p-type GaN barrier layer 6/$n^+$-type GaN contact layer 8 is grown on the GaN substrate 1 in that order.

Figure 4:
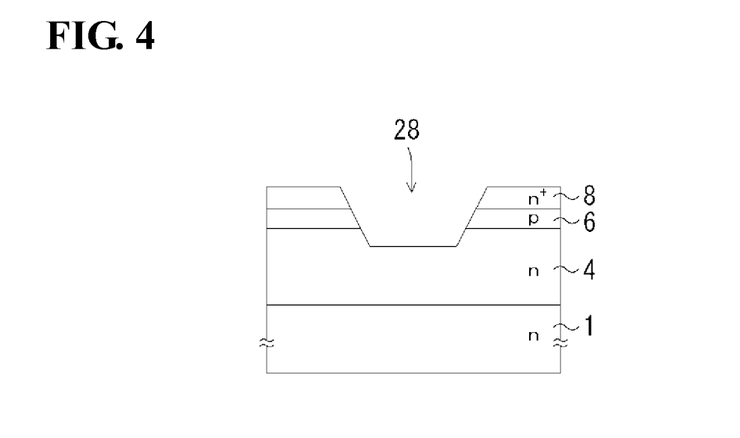
FIG. 4 is a diagram showing the state in which an opening has been formed in the GaN-based stacked layer.
Figure 5A:
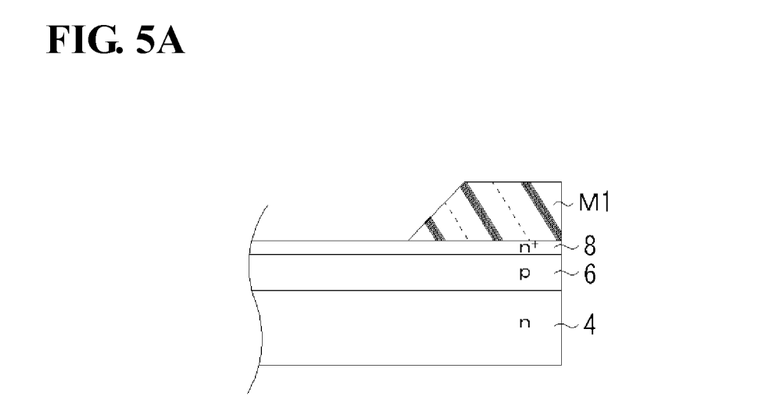
FIG. 5A is a diagram showing the states in which, at the stage of forming an opening by RIE, a resist pattern has been formed.
Figure 5B:
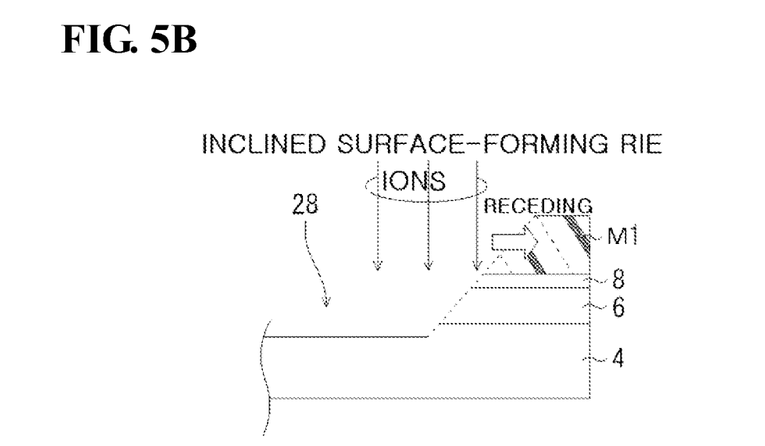
FIG. 5B is a diagram showing the states in which, at the stage of forming an opening by RIE, the stacked layer is etched down by performing ion irradiation and an opening is expanded (caused to recede).

Subsequently, as shown in FIG. 4, an opening 28 is formed by reactive ion etching (RIE). As shown in FIGS. 5A and 5B, a resist pattern M1 is formed on the top of epitaxial layers 4, 6, and 8. The resist pattern M1 is then etched by RIE to cause the resist pattern M1 to recede, whereby an opening is expanded to form an opening 28. In this RIE process, the inclined surface of the opening 28, that is, the end face of the GaN-based stacked layer 15 is damaged by being subjected to ion irradiation. In the damaged portion, for example, a high-density region of dangling bonds and lattice defects is formed. Conductive impurities derived from an RIE device or unspecified sources reach the damaged portion and thus enrichment occurs. The formation of the damaged portion results in an increase in drain leak current and thus the restoration needs to be performed. According to the formula (1), when hydrogen is contained in a certain concentration, the termination of the dangling bonds and the like and the passivation of the impurities can be achieved during the growth of a regrown layer 27 described below. The meaning of the upper limit and lower limit in the formula (1) has been described above.

Figure 6:
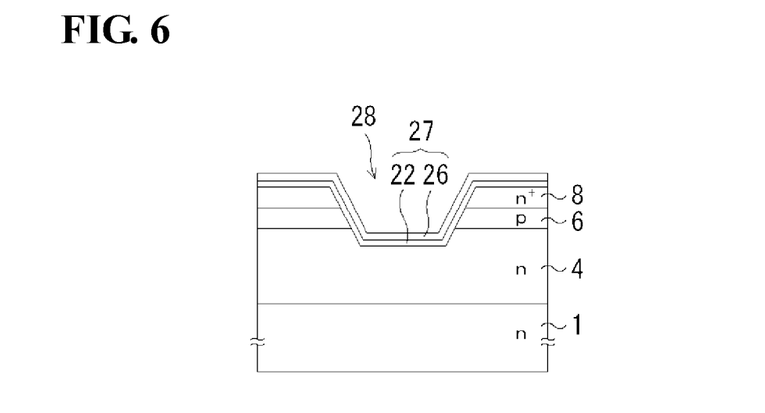
FIG. 6 is a diagram showing the state in which a regrown layer has been grown in the opening.
Figure 7:
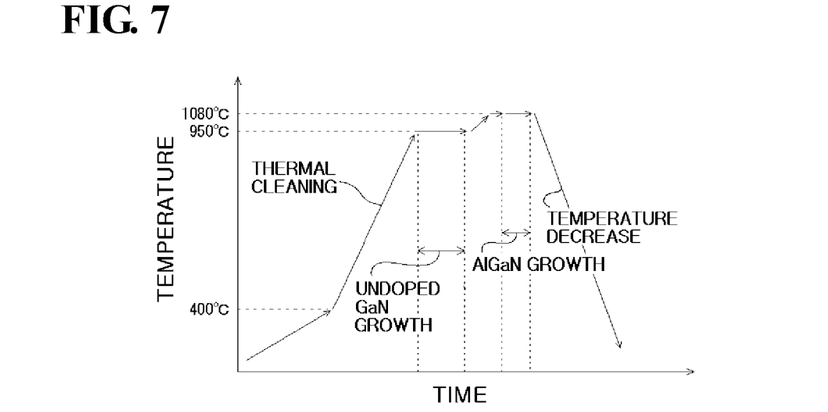
FIG. 7 is a diagram showing a temperature-time pattern in the growth of the regrown layer.

Subsequently, the resist pattern M1 is removed and the wafer is cleaned. The wafer is inserted into an MOCVD apparatus and a regrown layer 27 including an electron drift layer 22 composed of undoped GaN and an electron source layer 26 composed of undoped AlGaN is grown as shown in FIG. 6. In the growth of the undoped GaN layer 22 and undoped AlGaN layer 26, thermal cleaning is performed in an atmosphere of (NH$_3$+H$_2$), and then an organic metal material is supplied while (NH$_3$+H$_2$) is being introduced. FIG. 7 shows a temperature-time pattern in the growth of the GaN layer 22 and AlGaN layer 26. In the thermal cleaning before the formation of the regrown layer 27 or in the formation of the regrown layer 27, the restoration regarding the damaged portion and the passivation of the conductive impurities are allowed to proceed. Therefore, the atmosphere of (NH$_3$+H$_2$) during the growth of the regrown layer 27 is beneficial.

Figure 8:
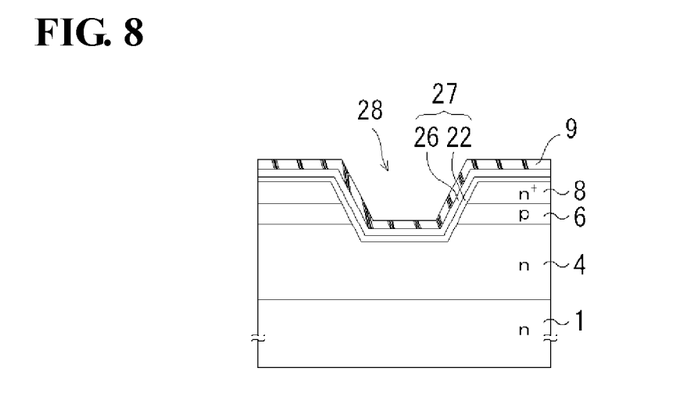
FIG. 8 is a diagram showing the state in which an insulating layer has been grown on the regrown layer.

Subsequently, the wafer is taken out of the MOCVD apparatus. An insulating layer 9 is grown as shown in FIG. 8. A source electrode S and a drain electrode D are formed on the top surface of the epitaxial layer and the bottom surface of the GaN substrate 1, respectively, by photolithography and ion beam deposition as shown in FIG. 1. Furthermore, a gate electrode G is formed on the side surface of the opening 28.

EXAMPLES

Example 1

Based on the production method described in the above embodiment, the semiconductor device 10 shown in FIG. 1 was produced by MOCVD. The Mg concentration A and hydrogen concentration B in the p-type barrier layer 6 were measured to determine a value of B/A. The production conditions and structure of the semiconductor device 10 are as follows.
<Conditions of MOCVD>
Gallium raw material: trimethylgallium
Nitrogen raw material: high-purity ammonia with a purity of 99.999% or more
Carrier gas: purified hydrogen with a purity of 99.999995% or more
n-type dopant: hydrogen-based silane
p-type dopant: bis(cyclopentadienyl) magnesium
<Each part of semiconductor device>
Substrate: conductive GaN substrate having a diameter of two inches
n-type GaN drift layer 4: thickness 5 µm, Si concentration 1 ×10$^{16}$ cm$^{-3}$
p-type GaN barrier layer 6: thickness 0.5 µm
n$^+$-type GaN contact layer 8: thickness 0.2 µm, Si concentration 1 ×10$^{18}$ cm$^{-3}$
Electron drift layer (undoped GaN) 22: thickness 0.1 µm
Electron source layer (undoped AlGaN layer) 26: thickness 0.02 µm, Al content 25%

Referring to FIG. 7, the undoped GaN layer 22 was grown at 950° C. for a growth time of about 240 seconds so as to have a thickness of 0.1 µm (100 nm). The undoped AlGaN (Al content 25%) layer 26 was grown at 1080° C. for a growth time of about 100 seconds so as to have a thickness of 0.02 µm (20 nm). After the undoped AlGaN layer 26 was grown, the supply of an organic metal material was stopped and the temperature was decreased in a nitrogen atmosphere.

Subsequently, the semiconductor device 10 serving as a test specimen was etched in the depth direction from the surface of the n$^+$-type contact layer 8 while at the same time the concentration distributions of magnesium (Mg) and hydrogen (H) in the depth direction were measured by secondary ion-microprobe mass spectrometry (SIMS).

Figure 9:
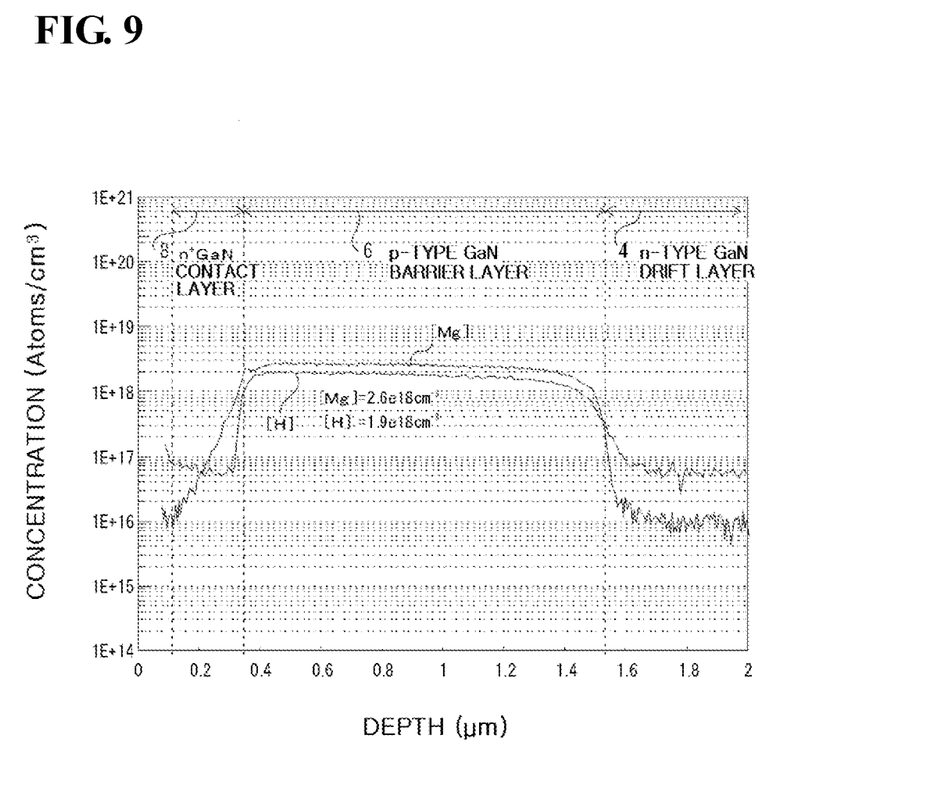
FIG. 9 is a diagram showing the distributions of hydrogen concentration and magnesium concentration in a p-type GaN barrier layer of a semiconductor device produced in Example 1.

FIG. 9 is a diagram showing the concentration distributions of magnesium and hydrogen in the depth direction, the concentration distributions being measured by SIMS. In the p-type GaN barrier layer 6, the magnesium concentration A was 2.6×10$^{18}$ (2.6e18) cm$^{-3}$. The hydrogen concentration B was 1.9×10$^{18}$ (1.9e18) cm$^{-3}$. Therefore, the value of B/A was 0.73, which satisfied not only the formula (1) above but also the formula (3) above. Accordingly, an effect of improving the breakdown voltage characteristics using the p-type GaN barrier layer 6 can be produced while at the same time dangling bonds and the like in the damaged portion generated during the formation of the opening 28 can be terminated to a higher degree and conductive impurities enriched in the damaged portion can be passivated to a higher degree.

Example 2

The semiconductor device shown in FIG. 1 was produced and the advantageous effects of the present invention were investigated. By changing the growth conditions of the p-type GaN barrier layer 6 and n$^+$-type contact layer 8 in the semiconductor device 10, a series of test specimens having different ratios of hydrogen mixed in the p-type GaN barrier layer 6 were produced. In addition to the test specimen having a value of B/A=0.73, a test specimen having a value of B/A=0.03 (Comparative Example) and test specimens having values of B/A=0.2, 0.6 (Invention Examples) were produced. In principle, the production process of the devices was the same as the above-described process. However, the hydrogen concentration in the carrier gas, the concentration of Mg serving as a p-type impurity, and the like were changed in accordance with a typical processing method so that the value of B/A changed in the above range.

Figure 10:
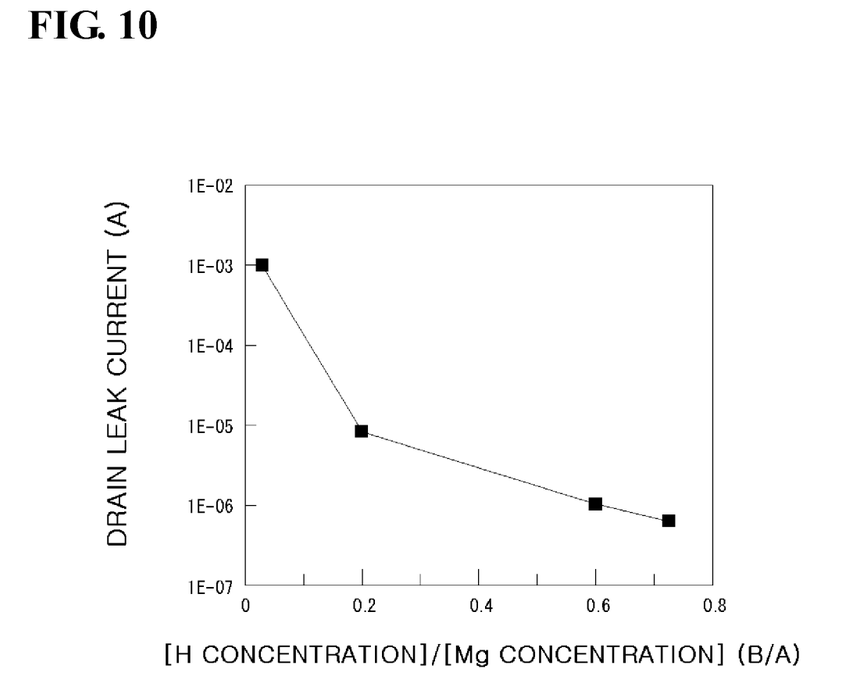
FIG. 10 is a diagram showing the measurement results of drain leak currents, in an off-state, of semiconductor devices produced by changing a value of B/A in Example 2.

A gate bias voltage was applied to each of the test specimens to provide an off-state. The drain currents (leak currents) of the test specimens having different values of B/A were compared with each other. In the comparison, the source-drain bias voltage was fixed at 10 V. FIG. 10 shows the measured drain leak currents. Referring to FIG. 10, in Comparative Example in which the value of B/A was 0.03, a large drain leak current of about 1.0E-3 (1.0×10$^{-3}$) A was observed. As the value of B/A increased, the drain leak current tended to decrease. When the value of B/A was about 0.1, a drain leak current of about 1.0E-4 (1.0×10$^{-4}$) A was observed. Furthermore, when the value of B/A was 0.2 or more, the drain leak current was reduced to 1.0E-5 (1.0×10$^{-5}$) A or less. Therefore, it was found that an effect of reducing drain leak current was significantly produced when the value of B/A was 0.1 or more.

The structures disclosed in the above embodiments of the present invention are mere examples and the scope of the present invention is not limited to these embodiments. The scope of the present invention is defined by the appended claims, and all changes that fall within the scope of the claims and the equivalence thereof are therefore embraced by the claims.

INDUSTRIAL APPLICABILITY

According to the semiconductor device or the like of the present invention, a drain leak current can be stably reduced in the transistor operation while high vertical breakdown voltage is achieved. A high current can be caused to flow in a vertical direction with low on-resistance and the drain leak current can also be reduced as described above. Thus, the semiconductor device is suitable as a high current switching device.

REFERENCE SIGNS LIST

1 GaN substrate
4 n-type GaN drift layer 6 p-type GaN barrier layer
8 n⁺-type GaN contact layer
9 insulating layer
10 vertical GaN-based FET
12 gate wiring line
13 gate pad
15 GaN-based stacked layer
22 undoped GaN electron drift layer (channel layer)
26 AlGaN electron source layer (carrier supply layer)
27 regrown layer
28 opening
A magnesium concentration
B hydrogen concentration
M1 resist pattern
D drain electrode
G gate electrode
S source electrode

The invention claimed is:

1. A semiconductor device including a GaN-based compound semiconductor stacked layer (GaN-based stacked layer) including a first conductivity-type drift layer, a second conductivity-type barrier layer located on the first conductivity-type drift layer, and a first conductivity-type contact layer located on the second conductivity-type barrier layer,
the GaN-based stacked layer having an opening that extends from the first conductivity-type contact layer and reaches the first conductivity-type drift layer through the second conductivity-type barrier layer, the semiconductor device comprising:
a regrown layer located so as to cover a portion of the GaN-based stacked layer that is exposed to the opening, the regrown layer including a channel layer composed of a GaN-based semiconductor and a carrier supply layer that supplies carriers to the channel layer;
an insulating layer located so as to cover the regrown layer;
a source electrode located on the GaN-based stacked layer;
a gate electrode located on the insulating layer; and
a drain electrode located on any one of first conductivity-type regions that are present opposite the first conductivity-type contact layer with a bottom of the opening located therebetween,
wherein, in the second conductivity-type barrier layer, a second conductivity-type impurity concentration A $(cm^{-3})$ and a hydrogen concentration B $(cm^{-3})$ satisfy $0.1<B/A<0.9$,
wherein the first conductivity-type contact layer is located between the second conductivity-type barrier layer and the source electrode.

2. The semiconductor device according to claim 1, wherein, in the second conductivity-type barrier layer, the second conductivity-type impurity concentration A $(cm^{-3})$ and the hydrogen concentration B $(cm^{-3})$ satisfy $0.5<B/A<0.9$.

3. The semiconductor device according to claim 1, wherein, in the second conductivity-type barrier layer, the second conductivity-type impurity concentration A $(cm^{-3})$ and the hydrogen concentration B $(cm^{-3})$ satisfy $0.7<B/A<0.9$.

4. The semiconductor device according to claim 1, wherein the first conductivity-type is an n-type, the second conductivity-type is a p-type, and a p-type impurity contained in the p-type barrier layer is magnesium (Mg).

5. The semiconductor device according to claim 4, wherein a magnesium concentration in the p-type barrier layer is $5×10^{17}$ $cm^{-3}$ or more and $5×10^{18}$ $cm^{-3}$ or less, and a hydrogen concentration in the p-type barrier layer is $4×10^{17}$ $cm^{-3}$ or more and $4×10^{18}$ $cm^{-3}$ or less.

6. The semiconductor device according to claim 4, wherein a concentration of silicon (Si) serving as an n-type impurity in the n-type contact layer is $1×10^{17}$ $cm^{-3}$ or more, and a silicon concentration in the n-type drift layer is $1×10^{15}$ $cm^{-3}$ or more and $5×10^{16}$ $cm^{-3}$ or less.

7. The semiconductor device according to claim 4, wherein the n-type contact layer has a thickness of 0.1 μm or more and 1.0 μm or less, the p-type barrier layer has a thickness of 0.1 μm or more and 2.0 μm or less, and the n-type drift layer has a thickness of 1 μm or more and 10 μm or less.

8. The semiconductor device according to claim 1, wherein a combination of the channel layer and carrier supply layer is one of combinations selected from an InGaN layer and an AlGaN layer, a GaN layer and an AlGaN layer, and an AlGaN layer and AlN.

9. The semiconductor device according to claim 1, wherein the channel layer is an undoped GaN layer having a thickness of 20 nm or more and 400 nm or less, and the carrier supply layer is an $Al_xGa_{1-x}N$ $(0<x<1)$ layer having a thickness of 5 nm or more and 40 nm or less.

10. A method for producing a semiconductor device including a GaN-based compound semiconductor stacked layer (GaN-based stacked layer) including a first conductivity-type drift layer, a second conductivity-type barrier layer located on the first conductivity-type drift layer, and a first conductivity-type contact layer located on the second conductivity-type barrier layer, the method comprising a step of forming an opening in the GaN-based stacked layer by reactive ion etching (RIE) so that the opening extends from the first conductivity-type contact layer and reaches the first conductivity-type drift layer through the second conductivity-type barrier layer;
a step of forming a regrown layer so as to cover a portion of the GaN-based stacked layer that is exposed to the opening, the regrown layer including a channel layer composed of a GaN-based semiconductor and a carrier supply layer that supplies carriers to the channel layer;
a step of forming an insulating layer so as to cover the regrown layer; and
a step of forming a source electrode on the GaN-based stacked layer, forming a gate electrode on the insulating layer, and forming a drain electrode on any one of first conductivity-type regions that are present opposite the first conductivity-type contact layer with a bottom of the opening located therebetween,
wherein, in formation of the second conductivity-type barrier layer, a second conductivity-type impurity concentration A $(cm^{-3})$ and a hydrogen concentration B $(cm^{-3})$ satisfy $0.1<B/A<0.9$,
wherein the first conductivity-type contact layer is located between the second conductivity-type barrier layer and the source electrode.

11. The method for producing a semiconductor device according to claim 10, wherein, in the formation of the second conductivity-type barrier layer, the second conductivity-type impurity concentration A $(cm^{-3})$ and the hydrogen concentration B $(cm^{-3})$ satisfy $0.5<B/A<0.9$.

12. The method for producing a semiconductor device according to claim 10, wherein, in the formation of the second conductivity-type barrier layer, the second conductivity-type impurity concentration A $(cm^{-3})$ and the hydrogen concentration B $(cm^{-3})$ satisfy $0.7<B/A<0.9$.

13. The method for producing a semiconductor device according to claim 10, wherein the first conductivity-type is an n-type; the second conductivity-type is a p-type; and the p-type barrier layer is grown by MOCVD using high-purity ammonia as a nitrogen raw material, purified hydrogen as a carrier gas, and cyclopentadienyl magnesium as a raw material for a p-type impurity.

14. The method for producing a semiconductor device according to claim 10, wherein, in the step of forming the regrown layer after the opening is formed by reactive ion etching, thermal cleaning is performed in an (ammonia+hydrogen) atmosphere, and then an undoped GaN channel layer and an undoped AlGaN carrier supply layer are grown by MOCVD using high-purity ammonia as a nitrogen raw material and purified hydrogen as a carrier gas.

* * * * *